United States Patent [19]
Hetrich

[11] 3,930,914
[45] Jan. 6, 1976

[54] THINNING SEMICONDUCTIVE SUBSTRATES

[75] Inventor: Harold Arthur Hetrich, Reading, Pa.

[73] Assignee: Western Electric Co., Inc., New York, N.Y.

[22] Filed: Aug. 1, 1974

[21] Appl. No.: 493,960

Related U.S. Application Data

[62] Division of Ser. No. 281,261, Aug. 16, 1972, Pat. No. 3,841,930, which is a division of Ser. No. 150,345, June 7, 1971, Pat. No. 3,701,705.

[52] U.S. Cl. .................................. 156/16; 156/17
[51] Int. Cl.² ........................................ H01L 7/50
[58] Field of Search .................... 156/8, 16, 17, 345

[56] References Cited
UNITED STATES PATENTS

| | | | |
|---|---|---|---|
| 2,958,147 | 11/1960 | Monahan | 156/16 X |
| 3,404,049 | 10/1968 | Shanefield et al. | 156/345 X |
| 3,447,985 | 6/1969 | Seitz | 156/345 X |

*Primary Examiner*—William A. Powell
*Attorney, Agent, or Firm*—R. Y. Peters

[57] ABSTRACT

In making a target for a television camera tube, it is necessary to thin the backside of a semiconductive substrate, which is opposite a face having a diode array thereon. To thin the substrate, it is positioned face down on a fluid nondeleterious to the substrate and diode array. The fluid is contained in a cavity of a holding device. The positioning is such that there is no space between the fluid and the substrate. An apertured top member is then mounted on the substrate and the holding device to retain the substrate on the fluid. The assembly of the holding device and top member with the substrate therebetween is immersed and rotated in an etchant to thin the backside of the substrate through the aperture of the top member. The fluid provides a tight seal on the face of the substrate to prevent the etchant from damaging such face and the diode array thereon. A vent extending from the cavity of the holding device to its outer edge assists in the subsequent removal of the substrate from the cavity.

10 Claims, 9 Drawing Figures

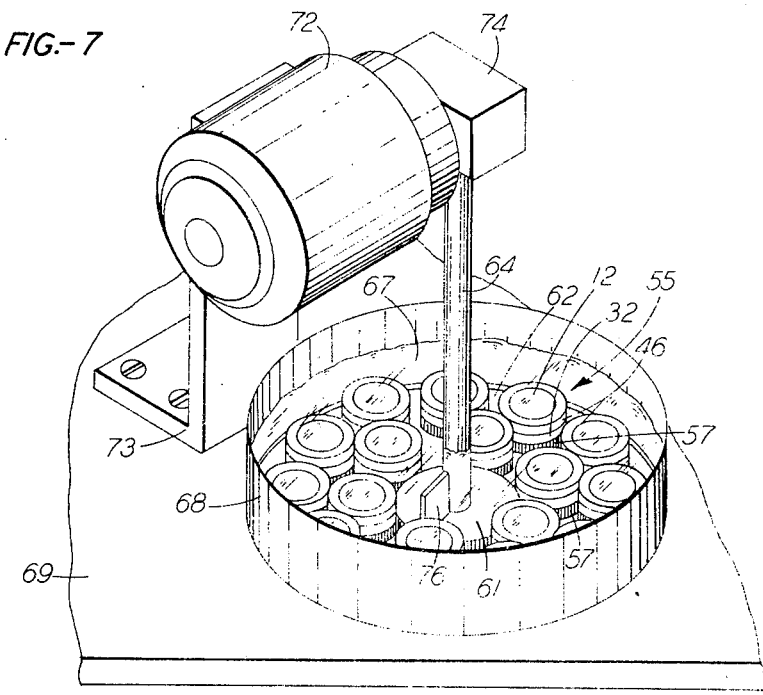
FIG.-7
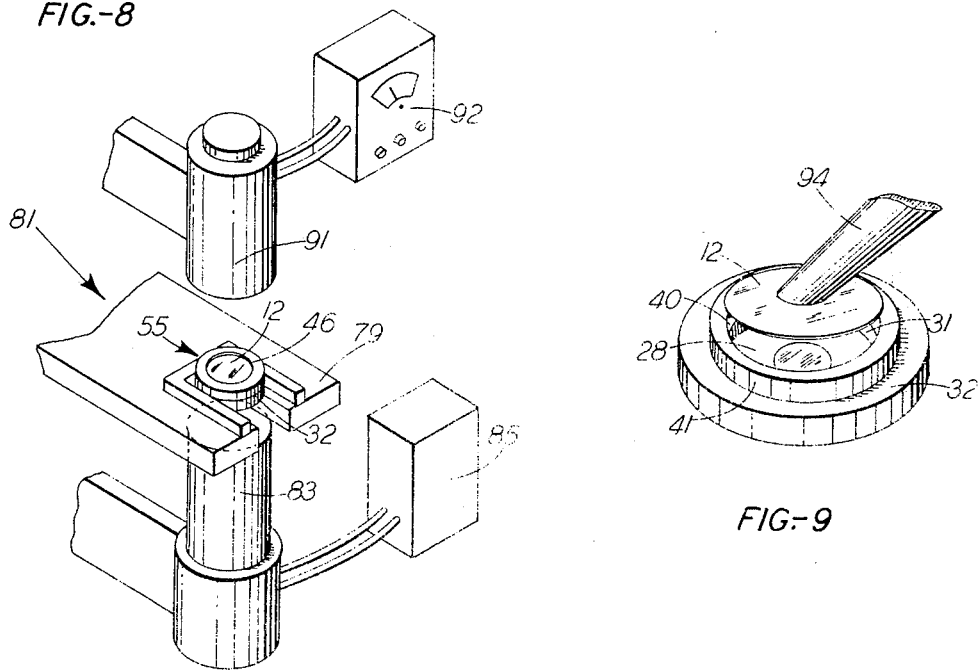
FIG.-8
FIG.-9

THINNING SEMICONDUCTIVE SUBSTRATES

This is a division of application Ser. No. 281,261 filed Aug. 16, 1972, now U.S. Pat. No. 3,841,930, which is a division of application Ser. No. 150,345 filed June 7, 1971, now U.S. Pat. No. 3,701,705.

BACKGROUND OF THE INVENTION

1. Field of the Invention

This invention relates to methods of thinning a workpiece, and more particularly, to methods of making diode-array targets from semiconductive substrates for electron-beam charge-storage devices such as television camera tubes.

2. Description of the Prior Art

This invention is particularly suited for use in the manufacture of semiconductive devices or the like. An example of such semiconductive devices are silicon targets having arrays of light-sensitive photo diodes for the storage of electron-beam charges, such as those disclosed in Reynolds U.S. Pat. No. 3,011,089 and Buck et al. U.S. Pat. Nos. 3,403,284 and 3,458,782.

While the invention is adapted to be used in conjunction with the masking of a number of different kinds of workpieces, it will be particularly described with respect to masking semiconductive substrates. These substrates are advantageously used in making diode-array targets for electron-beam charge-storage devices such as television camera tubes. The diode-array target is basically a flat semiconductive substrate having a closely spaced array of p-n junctions near one surface.

In fabricating the diode-array target in accordance with prior art techniques, an n-type substrate is prepared by sawing it from a silicon crystal ingot and then etching and polishing it. After a careful cleaning, a layer of silicon dioxide is formed over the entire substrate.

Next, a photoresist material is deposited on the face of the substrate and a fluid is directed on its backside. The substrate is then spun to coat evenly the face, while the fluid prevents the photoresist material from coating the backside. (See, e.g., co-pending application, Ser. No. 95,821, filed on Dec. 7, 1970 by L. F. Boyer and A. F. Johnson, Jr., assignors to Western Electric Co., Inc. and now issued into U.S. Pat. No. 3,695,928) The substrate is then exposed with the required diode-array pattern and developed to form apertures in the photoresist material. Etching of the substrate through these apertures follows to produce corresponding apertures in the silicon dioxide layer. Through the apertures in the silicon dioxide layer, boron is diffused to form p-type regions, with the dioxide layer acting as a diffusion mask. These p-type regions in the n-type substrate form the diode array on one side of the substrate.

Following the formation of the diode array, the substrate is subjected to a thinning operation involving numerous process steps. First, wax (such as that sold under the trademark "Apiezon") is applied to a sapphire supporting disc heated by a hot plate. In applying the wax an opening is left in the center of the disc for subsequent optical measurements for ascertaining the progression of the thinning of the substrate. The substrate is then placed on top of the waxed disc with the array side facing down and carefully centered. The assembly of the disc, wax and substrate is then removed from the hot plate and allowed to cool, leaving the substrate held to the disc by the wax.

Using a rotating tool, a rim of wax in a solvent is applied to the backside of the substrate using a small brush. After the wax dries, the central portion of the backside of the substrate is subjected to an etching operation wherein the substrate is immersed in an etchant and rotated therein for a period sufficient to thin the substrate down to a predetermined thickness. This thickness is considerably less than the diffusion length of minority carriers generated by absorbed light in the ultimate target and limits the amount of lateral diffusion of minority carriers in order to obtain high resolution in the target.

After the thinning, the substrate is rinsed, blown dry and optically measured. The substrate is then removed from the supporting disc by placing the assembly on the hot plate to soften the wax. The slice is mechanically slid off the sapphire disc and placed in three successive hot trichloroethylene baths and then in a boiling trichloroethylene solution followed by an alcohol soak and water rinse. This results in the removal of all traces of wax.

After the removal of the substrate from the disc, it is subjected to several finishing heat treatments. The first of these treatments is a shallow phosphorous diffusion to improve the blue sensitivity of the ultimate camera tube and to reduce its dark current. Next, the boron diffusion glass, which has been left on the array side of the substrate up to this point to protect it against phosphorous diffusion, is removed to expose the p-type regions of the diodes. At the same time that the boron diffusion glass is removed, the phosphorous diffusion glass is also removed.

Next, the substrate is annealed in hydrogen at a low temperature to further reduce the dark current of the ultimate camera tube. Finally, a resistive film is evaporated over the diode array and it is ready for evaluation. See Crowell et al U.S. Pat. No. 3,419,746.

The holding of the substrate in place with the wax and the other processing steps necessitated by the wax results in a messy, time-consuming process involving numerous process steps. These steps do not lend themselves to high-volume production. In addition, there are a number of impurities found in the wax, such as iron, magnesium and calcium. These impurities often lead to the contamination of the ultimately formed diode-array target.

In fabricating the diode array target, it is desirable to eliminate as many process steps as possible, especially the wax step. One prior art technique of eliminating the waxing step is to use a mechanical mask held to the slice by magnetic facilities. However, difficulty was experienced with this as a result of the etchant leaking to the array side of the substrate and rendering defective the ultimately fabricated target.

It is also desirable in the thinning operation, which results in the removal of about 90% of the material at the central portion of the substrate, that the removal take place in a controlled and uniform manner. This is because irregular etching results in high spots, holes, depressions and other surface non-uniformities, which render defective the ultimately fabricated diode-array target.

SUMMARY OF THE INVENTION

It is, therefore, an object of this invention to provide new and improved methods of thinning a workpiece.

A further object of this invention is to provide a method of protecting a workpiece from a deleterious substance.

Another object of this invention is the provision of improved methods of making a charge-storage device from a semiconductive substrate.

A further object of this invention is to provide an apparatus for selectively thinning a portion of a substrate.

With these and other objects in view, the present invention contemplates a new method of thinning a portion of a workpiece, which includes the steps of depositing a fluid in a cavity and positioning the face of the workpiece on the fluid to leave no space between the face of the workpiece and the fluid. The workpiece is then retained in the cavity with an apertured member, whereby the face and the portion of the workpiece opposite the face are masked by the fluid and the member. Next, the unmasked backside of the workpiece is treated through the aperture of the member to remove at least a portion of such workpiece, while the masked portion of the workpiece remains untreated.

This invention also contemplates a method of protecting a first portion of a workpiece from a deleterious substance, which includes the steps of positioning the first portion of the workpiece on a non-deleterious fluid so as to leave no space between the workpiece and the fluid and to seal the fluid to such first portion, and retaining the workpiece on the fluid with a member having an opening. Then a deleterious substance is applied through the opening to another portion of the workpiece, whereby the non-deleterious fluid sealed to the first portion of the workpiece excludes the deleterious substance from such first portion to thereby protect such first portion.

BRIEF DESCRIPTION OF THE DRAWINGS

Other objects and advantages of the present invention may be more clearly understood by reference to the following detailed description and the accompanying drawings, wherein:

FIG. 7 shows an etching mechanism including facilities for rotating substrates in an etchant to thin the substrates;

FIG. 8 shows facilities for optically checking the thickness of a thinned substrate; and FIG. 9 shows facilities for removing the substrates from the cavity and fluid therein.

DETAILED DESCRIPTION

DIODE-ARRAY TARGET

Figure 1:
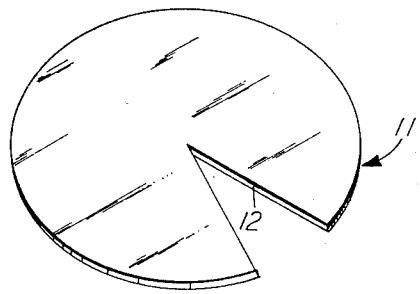
FIG. 1 is an enlarged perspective view, having a cutout section, of a fabricated diode-array target.
Figure 2:
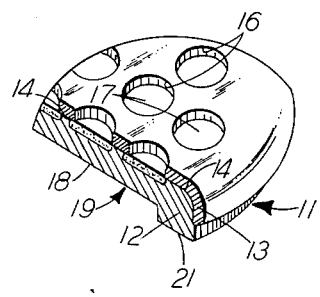
FIG. 2 is a greatly enlarged perspective view, partially in section, of that portion of the target of FIG. 1 enclosed in a phantom circle, illustrating sectional details of the target.

Referring now to the drawings and in particular to FIGS. 1 and 2, a diode-array target, designated generally by the numeral 11, is shown. The target 11 includes an n-type semiconductive substrate 12 (FIG. 2), preferably formed of silicon, having a layer 13 of silicon dioxide formed on the surface or face 14 thereof. Through the layer 13 a plurality of apertures 16 are formed. Corresponding to these apertures 16 are a plurality of p-type regions 17 which are formed through the apertures 16 and on the face 14 of the substrate 12. The p-type regions 17 together with the n-type substrate 12 form an array of light-sensitive photo diodes.

The substrate 12 has an extremely thin central portion 18 formed through its backside, designated generally by the numeral 19, for reducing the distance minority carriers must travel to the diodes on the opposite face 14 of the substrate 12 and for limiting the lateral diffusion of these carriers. The substrate 12 also includes a relatively thick rim 21 on the periphery of the backside 19 for supporting the substrate 12.

The diode-array target 11 is advantageously used in a television camera tube. In so using the target 11, the light being sensed impinges on the central portion 18 of the backside 19 of the substrate 12. This produces minority carriers that travel to the diode array on the opposite face 14, while an electron beam from a cathode (not shown) scans the diode array on the face 14.

Typically, the substrate 12 has the configuration of a disc with a diameter of about 850 mils and with the central portion 18 being about 760 mils in diameter and about 0.6 mils thick. The The rim 21 typically is about 5 mils thick. Usually there are about 1,000,000 individual diodes in the array on the face 14 of the substrate 12, and about 650,000 of these are used when the target 11 is mounted in a television camera tube. Obviously, the relatively proportions in FIGS. 1–9 have been exaggerated to more clearly illustrate the target 11, and the present invention.

FABRICATING METHOD

In fabricating the target 11 of FIGS. 1 and 2, the diode array is formed on the face 14 of the substrate 12, as previously explained. Then, the backside 19 of the substrate 12 is subjected to a thinning operation to form the central portion 18.

Depositing Fluid

Figure 3:
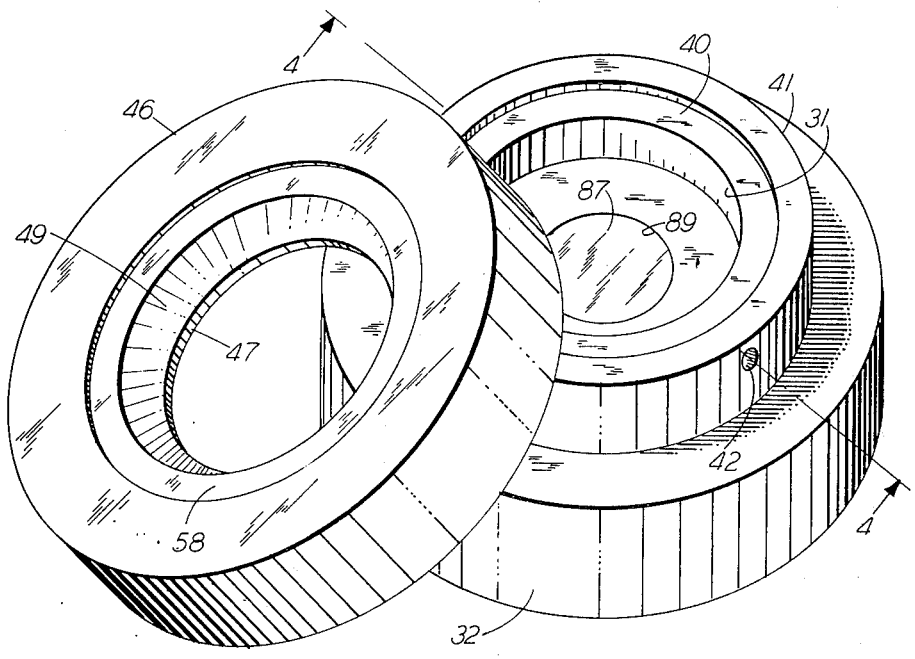
FIG. 3 is an enlarged perspective view of an apparatus, partially assembled, for masking a substrate to selectively thin a portion of its backside.
Figure 4:
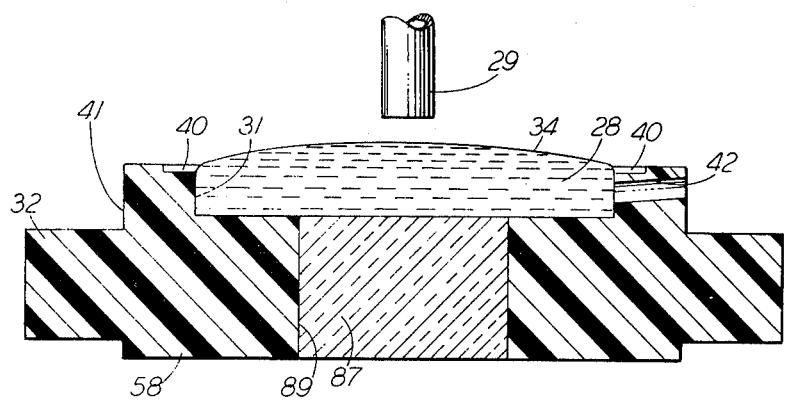
FIG 4 is a sectional view of a portion of the apparatus of FIG. 3, taken along the lines 4—4 of FIG. 3, showing a fluid from a source deposited in a cavity of a holding device.
Figure 5:
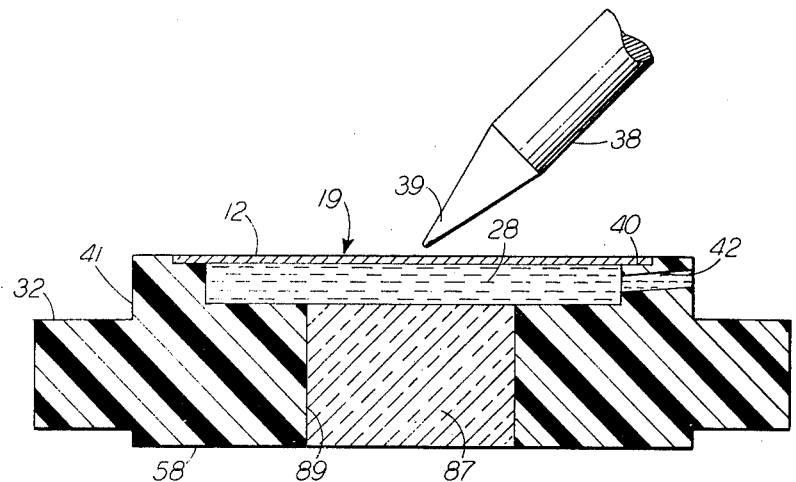
FIG. 5 shows the holding device of FIG. 4 with facilities for exerting a force on the backside of the substrate to force the quantity of fluid exceeding the volume of the cavity to flow out of the cavity.

To carry out the thinning operation, a quantity of a fluid 28 (FIG. 4) from a source 29 is deposited in a cavity 31 of a holding device 32 (FIGS. 3 and 4). Preferably, the device 32 is formed of material such as that sold under the trademark "Teflon" or the like.

The quantity of the fluid 28 deposited in the cavity 31 exceeds its volume and forms a meniscus 34 at the top of the cavity 31. The fluid 28 may be any fluid that has a nondeleterious effect on the substrate 12 and the holding device 32 and preferably is deionized water.

Positioning and Forcing Substrate

Next, the face 14, having the diode array thereon, of the substrate 12 is positioned on the meniscus 34 of the fluid 28. Using a device that will not damage the substrate 12, such as a plastic rod 38 (FIG. 5) having a tapered end 39, a force is then exerted on the backside 19 of the substrate 12.

The force of the rod 38 causes the quantity of the fluid 28 exceeding the volume of the cavity 31 to flow out of the cavity 31 and also seats the substrate 12 in a counterbore 40 of the holding device 32. Although most of the excess fluid 28 flows over a circumferential edge 41 of the holding device 32, some of it also flows out of a vent 42 in the device 32 that extends from the cavity 31 to the edge 41. The vent 42 has a diameter small enough so that surface tension prevents the fluid 28 from drawing from the cavity 31, except when the force is exerted on the backside 19 of the substrate 12 and transmitted to the fluid 28. When the force is so exerted, only a small quantity of the fluid 28 is forced from the cavity 31 through the vent 42 and there is still enough fluid 28 remaining in the cavity 31 so as to leave no space between the face 14 and the fluid 28 and to thereby mask the face 14 with the fluid 28. The force on the backside 19 also eliminates the meniscus 34.

Mounting Top Member

After the exertion of the force on the backside 19 of the substrate 12, a top member 46 (FIGS. 3 and 6) is mounted removably on the holding device 32. The member 46 is formed of a resilient material such as that sold under the trademark "Teflon" or the like.

Figure 6:
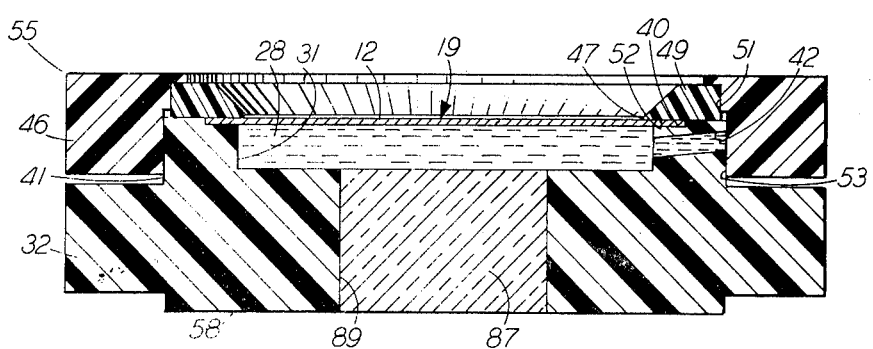
FIG. 6 shows the holding device of FIG. 4 with a resilient, apertured top member force fitted thereover.

An aperture 47 is formed in the top member 46, preferably by force fitting a washer 49 (FIGS. 3 and 6) in a central opening 51 of the top member 46, as shown in FIG. 6. Typically, the washer 49 is formed of a material such as sapphire or the like.

The mounting of the top member 46 positions a portion 52 of the bottom surface of the washer 49 that is adjacent the aperture 47 to overlap that portion of the backside 19 of the substrate 12 that will form the supporting rim 21 (FIG. 2) after a subsequent etching operation. The top member 46 also presses the overlapping surface of the washer 49 against such portion of the backside 19 to mask this portion. The mounting of the top member 46 also closes the vent 42.

To effect a force fit between the top member 46 and the holding device 32, the internal diameter 53 of the member 46 is made slightly smaller (by an amount equal to about 6 mils in diameter) than the external diameter of the circumferential edge 41 of the holding device 32. Of course, it should be understood that the top member 46 may also be threaded to the device 32 or other securing facilities may be used to mount removably the top member 46 to the holding device 32.

Etching

Next, an assembly, designated generally by the numeral 55 (FIGS. 6 and 7) of the holding device 32 with the top member 46 mounted thereon and with the substrate 12 therebetween and a plurality of other similar assemblies 55 are individually and removably mounted on a plurality of spur gears 57 (FIG. 7). In mounting the assemblies 55 on the gears 57, stepped portions 58 (FIGS. 4–6) of the holding device 32 are force fitted into associated depressions (not shown) on the top surfaces of the gears 57.

The gears 57 are arranged in groups so that three of such gears 57 engage each other, and one of such gears 57 of each group engages a larger central spur gear 61. The gears 57 and 61 are rotatably mounted to a circular platform 62 and, in addition, the gear 61 is fixed to a shaft 64.

After the assemblies 55 are mounted on the gears 57, by the use of the shaft 64 the assemblies 55, the gears 57 and 61, and the platform 62 are immersed in an etchant 67 contained in a tank 68 fixed to a base 69. Typically, the etchant 67 is a mixture of acetic acid saturated with iodine and hydrofluoric and nitric acids or equivalent.

Upon the immersion of the assemblies 55, the etchant 67 removes through the aperture 47 of the top member 46 small quantities of material from the backside 19 of the each 12 to thin them and eventually form the thin central portions 18 (FIG. 2) in the substrates 12.

A conventional motor 72 mounted by a bracket 73 to the base 69 rotates the shaft 64 through a standard gear box 74. Rotation of the shaft 64 rotates the central gear 61, which thereby rotates the gears 57 about their own axes. Typically, the gears 57 with the assemblies 55 thereon are rotated at about 60 to 120 rpm.

Rotation of the shaft 64 also rotates a paddle 76 to continually stir the etchant 67 to aid in maintaining the temperature of the etchant 67 uniform. Rotating the assemblies 55 imparts, of course, the same motion to the substrate 12 in the etchant 67. This motion coupled with the uniformity of temperature of the etchant 67 tends to bring about a more uniform removal of material from the backsides 19 in the thinning operation.

Due to the fluid 28 in the cavity 31 of the holding device 32, the absence of a space between the substrate 12 and the fluid 28 and the closing of the vent 42 by the top member 46, the face 14 with the diode array thereon is tightly sealed from the etchant 67 as well as its fumes. This results in a high degree of protection of the face 14 of the substrate 12. This protection is extremely important because damage to the 650,000 diodes in the array on the face 14 is likely to render the target 11 defective, and at this stage of the fabrication of the target 11, a substantial investment in processing time and materials has already been made in the target. Significantly, this protection is effectuated without the messy and time consuming waxing steps of the prior art.

The backside 19 of the substrate 12 is not as critical and as easily damaged as its face 14 which has the diode array thereon. Accordingly, the washer 52 which is pressed against substrate 12 by the top member 46 adequately masks and protects from the etchant 67 the portion of the backside 19 that will be the supporting rim 21 (FIG. 2) of the substrate 12. The rim 21 is formed as a result of the etching of the substrate 12.

Except for the substrate 12, all of the elements that are immersed in or contain the etchant 67 are resistant to it. These elements include the holding device 32, the top member 46, the washer 49, the gears 57 and 61, the platform 62, the shaft 64, the paddle 76, and the tank 68.

Optical Checking

After thinning, the substrates 12, the platform 62 along with the gears 57 and 61 and the assemblies 55 are lifted by the shaft 64 and removed from the etchant 67. Then, one of the assemblies 55 is placed on a slotted table 79 (FIG. 8) of an optical checking apparatus, designated generally by the numeral 81.

The apparatus 81 includes a conventional infrared light source 83 energized by a conventional power supply 85. The source 83 passes infrared radiation through a disc 87 (FIGS. 3–6) which is transparent to such radiation. The disc 87, typically formed of sapphire, is force fitted into a central aperture 89 of the holding device 32. The radiation also passes through the fluid 28 which is transparent to such radiation.

Depending on the thickness of the central portion 18 of the substrate 12, such substrate 12 passes a certain amount of the radiation. This radiation is sensed by a conventional infrared radiation detector 91 which displays the amount of radiation so sensed on a device 92. Since the amount of radiation passing through the substrate 12 is directly proportional to the thickness of such substrate 12, the display device 92 may be calibrated to read directly the thickness of the etched substrate 12. If the device 92 indicates that the substrate 12 has not been adequately thinned, the assembly 55 is removed from the table 79. Such assembly 55 is placed on the gear 57 from which it was removed, and it along with the other assemblies 55 are again immersed and rotated in the etchant 67 for an additional period of time and the thickness of the substrate is again checked.

On the other hand, if the device 92 indicates that the substrate 12 has been adequately thinned, (typically to a thickness of about 0.6 mils) the assembly 55 is removed from the table 79.

Removing the Top Member and Substrate

After the assembly 55 is removed from the table 79, if no additional thinning in the etchant 67 is necessary, the top member 46 is removed from the outer edge 41 of the holding device 32. The removal of the top member 46 opens the vent 42 that extends from the cavity 31 to the outer edge 41. The opening of the vent 42 permits atmospheric pressure to act on the cavity 31 through the vent 42 of the holding device 32.

Next, with the aid of a conventional vacuum pickup device 94 (FIG. 9), the substrate 12 is removed from the counterbore 40 of the holding device 32 and from the fluid 28 of the cavity 31. The atmospheric pressure acting on the cavity 31 assists in the removal of the substrate 12 by preventing a partial vacuum from forming between the substrate 12 and the fluid 28.

Hence, the substrate 12 has been thinned and the fabrication of the diode-array target 11 (FIGS. 1 and 2) is now complete, and the target 11 is now ready for evaluation with conventional electrical and mechanical tests. The other substrates 12 of other assemblies 55 are similarly removed from the holding devices 32 and evaluated.

While the invention has been described in connection with semiconductive substrates such as diode-array targets, it is to be understood that the invention may also be used in connection with other articles.

It is to be further understood that the above-described arrangements are simply illustrative of the application of the principles of this arrangement. Numerous other arrangements may be readily devised by those skilled in the art which embody the principles of the invention and fall within its spirit and scope.

What is claimed is:

1. A method of thinning a portion of a workpiece, which comprises the steps of:
   depositing a fluid in a cavity;
   positioning the face of the workpiece on the fluid to leave no space between the face of the workpiece and the fluid;
   retaining the workpiece in the cavity with an apertured member, whereby the face is masked by the fluid and a portion of the backside of the workpiece opposite the face is masked by the member; and
   treating through the aperture of the member the unmasked backside of the workpiece to remove at least a portion of such workpiece, while the masked face and the masked portion of the backside of the workpiece remain untreated.

2. The method of claim 1, wherein the treating is accomplished by etching through the aperture of the member the unmasked workpiece to remove at least a portion of such workpiece.

3. The method of claim 1, comprising the further step of optically checking the thickness of the etched workpiece by transmitting infrared radiation through the workpiece and the fluid.

4. A method of protecting a first portion of a workpiece from a deleterious substance, comprising:
   positioning the first portion of the workpiece on a non-deleterious fluid so as to leave no space between the workpiece and the fluid and to seal the fluid to such first portion;
   retaining the workpiece on the fluid with a member having an opening; and
   applying the deleterious substance through the opening to another portion of the workpiece, whereby the non-deleterious fluid sealed to the first portion of the workpiece excludes the deleterious substance from such first portion to thereby protect such first portion.

5. The method of claim 4, wherein the non-deleterious fluid is a liquid transparent to infrared radiation, the deleterious substance includes fumes and removes at least a part of the other portion of the workpiece, and the non-deleterious fluid excludes both the deleterious substance and its fumes from the first portion of the workpiece.

6. A method of selectively thinning a portion of a substrate, comprising the steps of:
   filling a cavity in an etchant-resistant holding device with a quantity of water exceeding the volume of the cavity to form a meniscus of the water at the top of the cavity;
   positioning the face of the substate on the water;
   exerting a force on the backside of a substrate opposite its face to force the quantity of the water exceeding the volume of the cavity to flow out of the cavity and over the outer edge of the device to thereby eliminate the meniscus and leave no space between the face and the water and thereby mask the face with the water;
   force-fitting a resilient, etchant-resistant top member having an aperture therein over the outer edge of the holding device:
      to tightly engage such member to such device, and
      to position a portion of the bottom surface of the top member that is adjacent the aperture to overlap and thereby mask an annular area on the backside; and
   immersing the holding device and the top member with the substrate therebetween in an etchant to etch and thereby thin a central portion of the backside corresponding to the inner area of the aperture of the top member, while the face masked by the water and the annular area on the backside masked by the overlapping surface of the top member are not etched and thinned.

7. The method of claim 6, further comprising the steps of:
   rotating in the etchant an assembly of the holding device and the top member with substrate therebetween about its central axis; and stirring simultaneously the etchant to improve the uniformity of the thinning of the substrate.

8. The method of claim 7, further comprising the steps of:
   removing the assembly from the etchant after the central portion of the substrate has been thinned;
   removing the top member from the outer edge of the holding device to open a vent extending from the cavity to such outer edge to admit atmospheric pressure to the cavity; and
   removing the substrate from the water in the cavity of the holding device, whereby the admission of atmospheric pressure assists in the removal of the substrate by preventing a partial vacuum from forming between the substrate and the water.

9. An improved method of making a charge storage device from a semiconductive substrate having a face and a backside opposite the face wherein a diode array is formed on the face, wherein the backside of the substrate is subjected to a thinning operation, wherein the improvement comprises:
   filling a cavity of a device with a quantity of fluid exceeding the volume of the cavity to form a meniscus of the fluid at the top of the cavity;
   positioning the face of the substrate on the fluid;
   exerting a force on the backside of the substrate to force the quantity of fluid exceeding the volume of the cavity to flow out of the cavity to eliminate the meniscus and leave no space between the face of the substrate and the fluid and thereby mask the face with the fluid;
   mounting a top member having an aperture therein on the holding device to position a portion of the bottom surface of the top member that is adjacent the aperture to overlap such backside to thereby mask an annular area on the backside corresponding to the overlapping surface; and
   etching the unmasked portion of the substrate through the aperture in the top member to thin a central portion of the backside corresponding to the inner area of the aperture.

10. A method of making an electron beam target, having a face and a backside, comprising the steps of:
   forming a diode array on the face of a substrate;
   depositing a fluid in a cavity of a device;
   positioning the face of the substrate on the fluid to leave no space between the face of the substrate and the fluid;
   mounting an annular member on the backside of the substrate; and
   etching the backside of the substrate through the annular member to thin the substrate while the fluid masks the face and a portion of the bottom surface of the annular member masks the backside of the substrate.

* * * * *